United States Patent [19]

Takahashi et al.

[11] Patent Number: 4,849,714
[45] Date of Patent: Jul. 18, 1989

[54] SIGNAL GENERATING APPARATUS

[75] Inventors: Hiroshi Takahashi, Tokyo; Hitoshi Nishiyama, Atsugi, both of Japan

[73] Assignee: Anritsu Corporation, Tokyo, Japan

[21] Appl. No.: 200,700

[22] Filed: May 31, 1988

[30] Foreign Application Priority Data

Jun. 5, 1987 [JP] Japan ............... 62-139902

[51] Int. Cl.⁴ ............................................. H03L 7/18
[52] U.S. Cl. ...................................... 331/1 A; 331/16; 331/25
[58] Field of Search ............... 331/1 A, 16, 18, 25; 455/260

[56] References Cited

U.S. PATENT DOCUMENTS 4,714,899 12/1987 Kurtzman et al. ................ 331/1 A

*Primary Examiner*—David Mis
*Attorney, Agent, or Firm*—Frishauf, Holtz, Goodman & Woodward

[57] ABSTRACT

The frequency setting data for setting a preset voltage of a VCO and a frequency dividing ratio of a frequency divider are latched in a data register. A control section includes two registers for latching the data latched in the data register, and a control circuit for determining the latch timings of the registers. One register supplies the latched data to the frequency divider. Another register supplies the latched data through a D/A converter to the VCO. When new frequency setting data is set in the data register, the control circuit delays the frequency setting data latched in the data register by at least one period of the reference signal with respect to the latching time, and supplies it simultaneously to the registers.

20 Claims, 3 Drawing Sheets

FIG. 2A CK 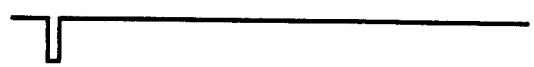
FIG. 2B fref 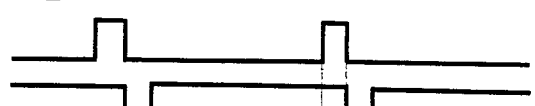
FIG. 2C DS
FIG. 2D A 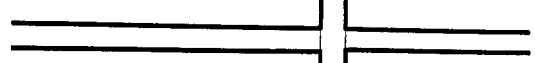
FIG. 2E B
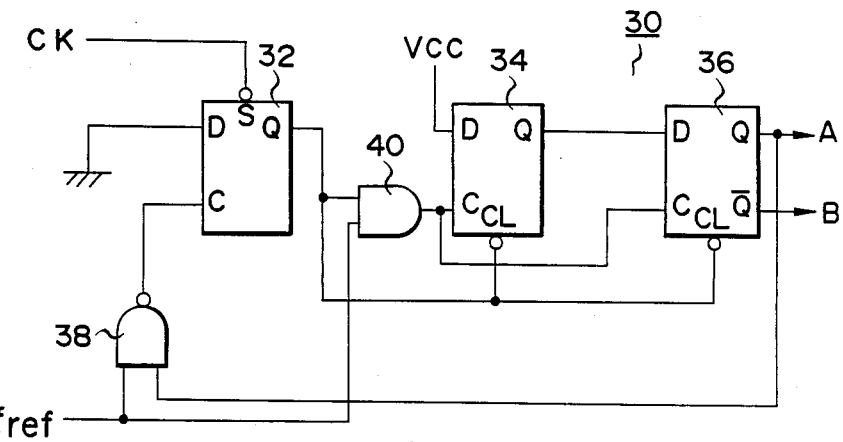
FIG. 3
FIG. 5A CK 
FIG. 5B fref 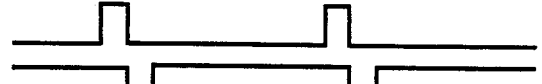
FIG. 5C DS 
FIG. 5D A' 
FIG. 5E B' 

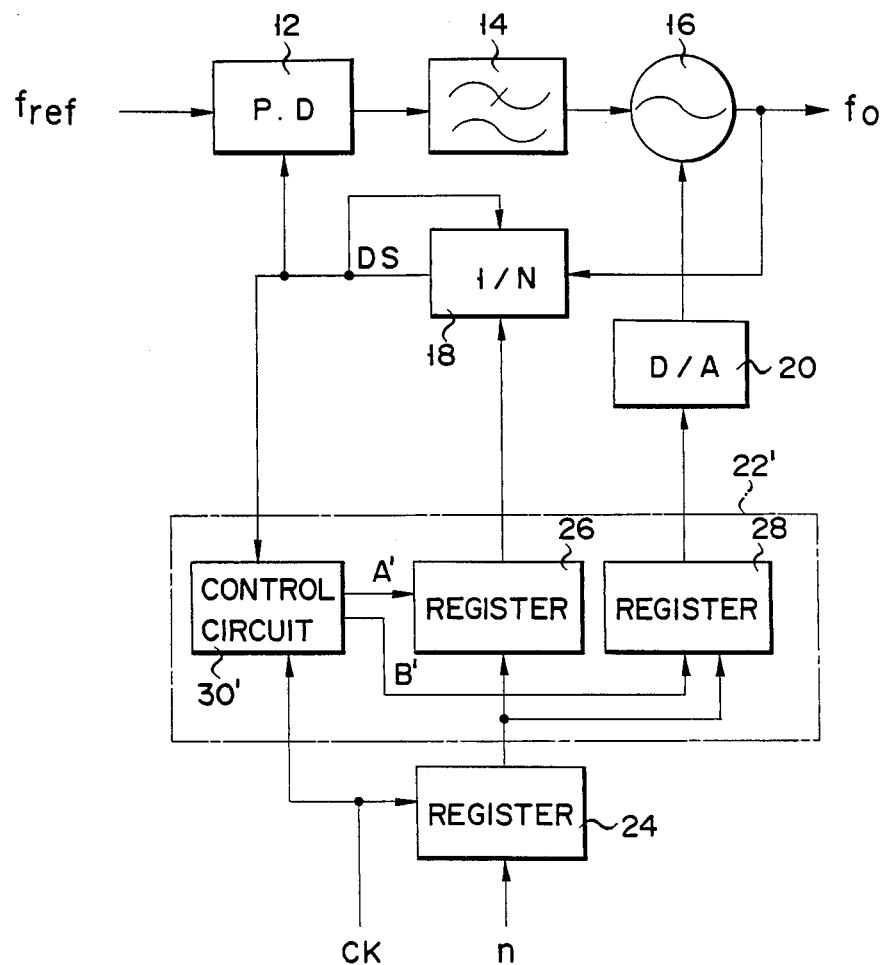
F I G. 4

SIGNAL GENERATING APPARATUS

BACKGROUND OF THE INVENTION

1. Field of the Invention

This invention relates to a phase locked loop (PLL) type signal generating apparatus and, more particularly, to a signal generating apparatus of a type wherein a signal at a desired frequency is generated by a voltage controlled oscillator (VCO), through a stable and fast switching operation.

2. Description of the Related Art

Nowadays, PLL type signal generators are employed in a wide variety of devices, such as network analyzers and radio receivers, for example. This type of signal generator is made up of a phase detector, a loop filter, a VCO, and a frequency divider. An output signal from the VCO—being the output signal of the signal generator —is frequency divided by the frequency divider, and is then supplied to the phase detector, where it is compared with a reference signal, and the comparison result supplied, via the loop filter, to the VCO. In the VCO, the frequency of the output signal is controlled so that the phase difference between the frequency divided signal and the reference signal becomes zero, and locked at a desired frequency.

Some of such signal generators are capable of changing a frequency dividing ratio of the frequency divider. This type of the signal generator includes a register for latching the frequency dividing ratio as externally supplied. The register latches the frequency dividing ratio, i.e., the frequency setting data, when supplied with a clock signal as a latch signal from exterior. The latched frequency setting data is applied to the frequency divider, from the register. The latched data is also supplied to the VCO. A preset voltage value of the VCO is changed according to the supplied frequency setting data. Thus, in the signal generator of this type, in order to vary the frequency of the output signal, the frequency dividing ratio of the frequency divider and the preset voltage value of the VCO are changed by changing the frequency setting data.

The frequency divider of the signal generating apparatus is made up of a counter, for example. A pulse output every time the counter overflows, is supplied as a frequency dividing signal to the phase detector. The overflow pulse is also fed back to the frequency divider. At the timing of outputting the pulse, the frequency divider reloads the latched frequency setting data from the register. In this way, the frequency dividing operation is repeated in accordance with the reloaded data. Accordingly, if the frequency setting data newly set is latched into the register, this new frequency setting data is loaded into the frequency divider at the timing of the overflow pulse. Subsequently, the frequency divider will operate on the basis of the new frequency setting data.

Before such frequency setting data is supplied to the VCO, the data is converted into an analog signal by a digital to analog (D/A) converter. The D/A converter produces a preset voltage of the VCO, which amounts to the frequency setting data latched in the register. In this way, the preset voltage of the VCO is changed by changing the frequency setting data, to vary the frequency of the output signal.

The conventional signal generator latches the frequency setting data into the register in response to the external clock signal. Therefore, the preset voltage of the VCO is changed simultaneously with the change of the data in the register. The frequency divider fetches the data of the register only when the overflow pulse is generated. Therefore, if the frequency of the output signal is changed by changing the preset voltage in the VCO, the frequency divider continues the counting operation according to the the previous frequency dividing data till the next overflow pulse occurs.

When the clock pulse is input to the register immediately after the overflow pulse occurs, the preset voltage immediately becomes a voltage amounting to the frequency newly set. However, the first time operation of the frequency divider is performed on the basis of the previous frequency dividing ratio, i.e., the dividing ratio before the frequency is switched. Therefore, the frequency divided signal output from the frequency divider will have a large phase difference with respect to the reference signal. This phase error varies depending on the timings of the clock pulse for the register and the overflow pulse of the frequency divider. In the PLL, the longer the pull-in operation, the larger the phase error. The times taken for the frequency changing are varied due to the timings of these two pulses, resulting in an unstable operation of the signal generator.

SUMMARY OF THE INVENTION

Accordingly, an object of this invention is to provide a signal generating apparatus which performs a stable and fast frequency changing operation by minimizing and fixing an initial phase error at the time of frequency switching, with the synchronization of the changing of the frequency dividing ratio, setting for the frequency divider with the changing of preset voltage setting by the D/A converter.

According to one aspect of this invention, there is provided a signal generating apparatus comprising:

voltage controlled oscillator (VCO) means for generating an output signal of the signal generating apparatus, an oscillating frequency of the VCO means being coarsely adjustable by a preset voltage;

frequency dividing means for frequency dividing the output signal of the VCO means according to a preset frequency divided ratio;

phase comparing means for comparing the phases of the output signal of the frequency dividing means with a reference signal, and outputting a signal based on the result of the comparison to the VCO means, the oscillating frequency of the VCO means being finely adjustable by the output signal of the phase comparing means;

data output means for outputting frequency setting data as the data representative of the preset voltage of the VCO means and the data representative of a frequency divided ratio of the frequency dividing means;

digital to analog (D/A) converting means for converting the frequency setting data from the data output means into the preset voltage, and applying the present voltage to the VCO means; and control means, provided between the data output means and the D/A converting means, for receiving the reference signal, and supplying the frequency setting data to the D/A converting means in synchronism with the reference signal.

According to another aspect of this invention, there is provided a signal generating apparatus comprising:

voltage controlled oscillator (VCO) means for generating an output signal of the signal generating apparatus, an oscillating frequency of the VCO means being coarsely adjustable by a preset voltage;

frequency dividing means for frequency dividing the output signal of the VCO means according to a preset frequency divided ratio;

phase comparing means for comparing the phases of the output signal of the frequency dividing means with a reference signal, and outputting a signal based on the result of the comparison to the VCO means, the oscillating frequency of the VCO means being finely adjustable by the output signal of the phase comparing means;

data output means for outputting frequency setting data as the data representative of the preset voltage of the VCO and the data representative of a frequency divided ratio of the frequency dividing means;

digital to analog (D/A) converting means for converting the frequency setting data from the data output means into the preset voltage, and applying the present voltage to the VCO means; and control means, provided between the data output means and the D/A converting means, for receiving the output signal of the frequency dividing means, and supplying the frequency setting data to the D/A converting means in synchronism with the output signal of the frequency dividing means.

According to yet another aspect of this invention, there is provided a signal generating apparatus comprising:

voltage controlled oscillator (VCO) means for generating an output signal of the signal generating apparatus, an oscillating frequency of the VCO means being coarsely adjustable by a preset voltage;

data latching means for latching the frequency setting data externally supplied, according to a control signal externally supplied;

frequency dividing means for frequency dividing the output signal from the VCO means according to a frequency dividing ratio based on the frequency setting data and for outputting a frequency divided signal, the frequency dividing means fetching the frequency setting data latched in the data latching means at the pulse timings of the frequency divided signal;

phase comparing means for comparing the phases of the frequency divided signal of the frequency dividing means with a reference signal, and outputting a signal based on the result of the comparison to the VCO means, th oscillating frequency of the VCO means being finely adjustable by the output signal of the phase comparing means;

digital to analog (D/A) converting means for converting the frequency setting data from the data latching means into the preset voltage, and applying the present voltage to the VCO means; and control means for supplying the frequency setting data latched in the data latching means to the D/A converting means in synchronism with the operation of the frequency dividing means for fetching the frequency setting data, according to the control signal.

BRIEF DESCRIPTION OF THE DRAWINGS

FIGS. 2A to 2E show a set of waveforms of the signals at key portions in the circuit of FIG. 1;

FIG. 3 shows a circuit diagram of a control circuit in the FIG. 1 circuit;

FIG. 4 shows a block diagram of a signal generating apparatus according to another embodiment of this invention; and FIGS. 5A to 5E show a set of waveforms of the FIG. 4 circuit.

DETAILED DESCRIPTION OF THE PREFERRED EMBODIMENTS

Figure 1:
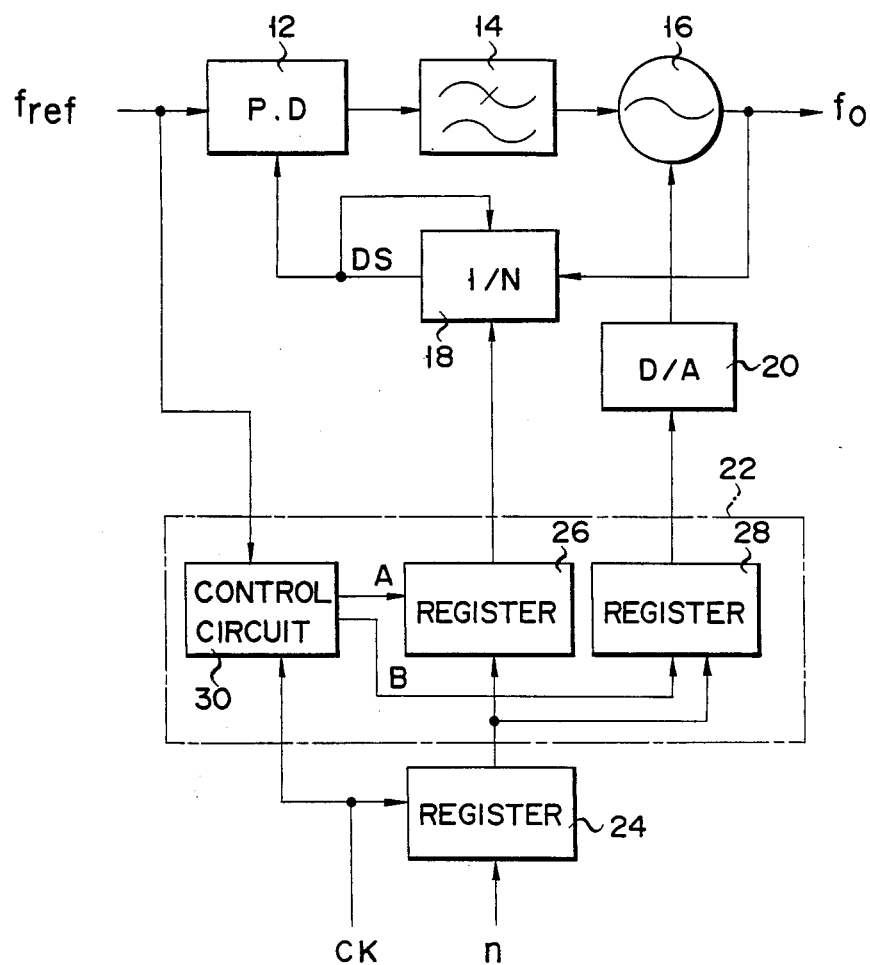
FIG. 1 shows a block diagram of a circuit arrangement of a signal generating apparatus according to one embodiment of this invention.

Reference is made to FIG. 1 illustrating in block form a scheme of a signal generating apparatus, which is a preferred embodiment of this invention. The signal generating apparatus according to this embodiment is comprised of phase detector 12, loop filter 14, VCO 16, frequency divider 18, D/A converter 20, control section 22, and data register 24. Data register 24 latches the frequency setting data "n" applied from external units (not shown) such as a control unit and an input unit, according to clock signal CK as a latch signal applied from an external device.

This signal generating apparatus produces output signal $f_o$ at a desired frequency by changing the setting of a frequency dividing ratio N of frequency divider 18 and changing a preset voltage of the VCO. Control section 22 is for stabilizing the frequency changing operation by minimizing and fixing a phase error generated at the time of this frequency changing. To this end, control section 22 operates so that the changing of the frequency setting data supplied to D/A converter 20 is synchronized with the fetching of that data by frequency divider 18.

Phase detector 12 detects the phase of frequency divided signal DS from frequency divider 18 and the phase of reference signal $f_{ref}$ supplied from a reference signal source (not shown), and supplies a difference signal proportional to that phase difference. The difference signal is converted DC voltage signal by loop filter 14, and supplied to VCO 16. As a result, the oscillating frequency of VCO 16 is controlled so that the phase difference between frequency divided signal DS and reference signal $f_{ref}$ becomes zero. Loop filter 14 applies a predetermined processing to the difference signal supplied from phase detector 12, and supplies it to VCO 16. This loop filter 14 determines a response characteristic of the phase locked loop. VCO 16 is controlled by the difference signal from phase detector 12 and the preset voltage according to the output signal from D/A converter 20. VCO 16 produces output signal $f_o$ at a frequency N times that of reference signal $f_{ref}$, depending on the frequency dividing ratio N of frequency divider 18.

Frequency divider 18 fetches the frequency setting data "n" latched in data register 24, through the register 26 for frequency dividing data in control section 22. The output signal $f_o$ of VCO 16 is frequency divided by the frequency dividing ratio N based on the frequency setting data "n", and the frequency divided signal DS is supplied to phase detector 12 as a feedback signal. This frequency divider 18 includes a counter, for example, which counts output signal $f_o$ by frequency dividing data N, and supplies the output pulse, which is due to an overflow in the counter, to phase detector 12. In the frequency divider 18, the overflow pulse is fed back thereto, and fetches the frequency setting data "n" latched in register 26 at the timing of this pulse. When new frequency setting data "n" is latched in register 26, frequency divider 18 fetches this data at the timing of the overflow pulse, to change its frequency dividing ratio N.

D/A converter 20 receives the frequency setting data "n" latched in data register 24, through register 28 for preset voltage data in control section 22, and supplies a preset voltage amounting to the value of this data "n" to VCO 16.

Control section 22 further includes control circuit 30. Control circuit 30 produces control signals A and B for controlling the fetching operation of registers 26 and 28. Under control of these control signals, the operation of frequency divider 18 for fetching the frequency setting data "n" is synchronized with the operation for changing the frequency setting data for D/A converter 20. Specifically, control circuit 30 generates these two control signals A and B using the clock signal CK as is shown in FIG. 2A and the reference signal $f_{ref}$ as is shown in FIG. 2B. As shown, these control signals have inverted levels with respect to each other, are delayed with respect to clock signal CK, and are synchronized with reference signal $f_{ref}$. First control signal A rises at the time of the second pulse of the reference signal $f_{ref}$ as counted from clock signal CK. Secon control signal B falls at the time of the second pulse of reference signal $f_{ref}$.

Turning now to FIG. 3, there is shown a circuit arrangement of control circuit 30 for producing such control signals A and B. Control circuit 30 is comprised of three flip-flops 32, 34 and 36, and two gates 38 and 40. Clock signal CK is applied as an inverted signal to the set terminal S of first flip-flop 32. The data terminal D of flip-flop 32 is grounded. The clock terminal C is connected to the output terminal of NAND gate 38 coupled at the first input terminal with reference signal $f_{ref}$. The output terminal Q of flip-flop 32 provides an output signal, which in turn is applied to a first input terminal of AND gate 40, and applied in an inverted form to the clear terminals CL of flip-flops 34 and 36. AND gate 40 is coupled at the second input terminal with reference signal $f_{ref}$. The output terminal of this AND gate 40 is coupled with the clock terminals C of flip-flops 34 and 36.

The data terminal D of flip-flop 34 is coupled with power source $V_{cc}$. The output signal at the output terminal Q thereof is transferred to the data terminal D of flip-flop 36. First control signal A is derived from the output terminal Q of flip-flop 36. Second control signal B is derived from the inverted output terminal $\overline{Q}$. The first control signal A is supplied to the second input terminal of NAND gate 38.

It should be understood that the control circuit applicable for the signal generating circuit according to this invention is not limited to such a control circuit 30, but it may be any type of circuit, if it can produces two control signals A and B which are delayed with respect to clock signal CK, but synchronized with reference signal $f_{ref}$.

First control signal A is supplied to the register 26 for frequency dividing data, as is shown in FIG. 1. This register 26 executes the fetching operation of the frequency setting data "n" as latched in data register 24 at the time that control signal A rises. Therefore, if new frequency setting data "n" is set in data register 24 in response to clock signal CK, frequency divider 18 performs the frequency dividing operation using the old data, till control signal A has risen.

Second control signal B has been supplied to the register 28 for preset voltage data. Register 28 executes the fetching operation of the frequency setting data "n" as latched in data register 24 at the time that second control signal B rises. Therefore, the fetching operation of this register 28 is delayed with respect to that of register 26, by one pulse width of reference signal $f_{ref}$.

In the signal generating apparatus thus arranged, reference signal $f_{ref}$ supplied to phase detector 12 is synchronized with frequency divided signal DS as a feedback signal to frequency divider 18 when the phase is locked. As is shown in FIGS. 2B and 2C, the pulse of frequency divided signal DS falls in synchronism with the falling of the pulse of reference signal $f_{ref}$. Accordingly, as described above, the operation of frequency divider 8 for fetching the frequency setting data "n", which is performed at the pulse timing of frequency divided signal DS, is performed at the falling timing of the pulse of reference signal $f_{ref}$. Therefore, when the frequency setting data "n" is changed, the fetching operation of frequency divider 18 is performed immediately after new frequency setting data "n" is loaded into register 26. The timing of changing the preset voltage by D/A converter 20 depends on the timing of latching new frequency setting data in register 28.

The operation by frequency divider 18 for fetching the new frequency setting data "n", and the operation by D/A converter 20 for changing the preset voltage are performed at the time that reference signal $f_{ref}$ falls. Therefore, there never occurs a situation that at the time of frequency changing, frequency divider 18 and D/A converter 20 operate on the basis of the old and new data, respectively. As a result, the phase difference at the time of frequency changing is substantially fixed, ensuring a fast and stable PLL operation. The phase difference at the time of frequency changing is due to a slight time difference from reference signal $f_{ref}$. This time difference is substantially determined by a response performance of circuit elements, and is almost constant. Therefore, as the frequency of reference signal $f_{ref}$ is lower, the time difference is lower. With this, the phase difference relative to reference signal $f_{ref}$ becomes lower, leading to a more fast and stable PLL operation.

Latch clock signal CK for data register 24 is not synchronism with reference signal $f_{ref}$ for determining the latch timing of registers 26 and 28. Therefore, there is the possibility that the pulse of reference signal $f_{ref}$ appears immediately after the pulse of clock signal CK. If such a situation occurs, when the data fetching operations by registers 26 and 28 is are performed at the timing of the first pulse of reference signal $f_{ref}$ as counted from the pulse timing of clock signal CK, register 26 starts the latching operation before register 24 has completed the latching operation, possibly resulting in an erroneous data latching. In this embodiment, control circuit 30 controls the data latching operations of registers 26 and 28 so that these latching operations are delayed by at least one period of reference signal $f_{ref}$, ensuring a reliable latching of data.

In the above mentioned embodiment, control circuit 30 generates control signals A and B by using clock signal CK and reference signal $f_{ref}$. As described above, reference signal $f_{ref}$ and frequency divided signal DS as a feedback signal are synchronized with each other. Therefore, it is evident that the frequency divided signal DS may be substituted by reference signal $f_{ref}$, as is shown in FIG. 4.

As shown, control section 22′ includes registers 26 and 28, and control circuit 30′. Control circuit 30′ produces control signals A′ and B′ for controlling the fetching operation of registers 26 and 28, so as to synchronize the operation of fetching the frequency setting data "n" of frequency divider 18 with the operation of changing the frequency setting data "n" by D/A converter 20. Control circuit 30' produces two types of control signals A' and B' by using clock signal CK as is shown in FIG. 5A and frequency divided signal DS as is shown in FIG. 5C. These control signals A' and B' are delayed with respect to clock signal CK, and is synchronized with frequency divided signal DS. Specifically, first control signal A' falls at the time that the first pulse of frequency divided signal DS as counted from the pulse timing of clock signal CK falls. Second control signal B' falls at the time that the second pulse of frequency divided signal DS falls. Control circuit 30' may be arranged variously, and may be any circuit if it can produce two types of control signals A' and B', which are delayed with respect to clock signal CK, and are synchronized with frequency divided signal DS.

First control signal A' is supplied to the register 26 for frequency dividing data, as is shown in FIG. 4. This register 26 fetches the frequency setting data "n" as latched in data register 24 at the time that control signal A' rises. Therefore, at the first pulse of frequency divided signal DS as counted from the pulse timing of clock signal CK, register 26 does not yet perform the fetching operation of the frequency setting data "n". Immediately after the first pulse of frequency divided signal DS, register 26 fetches the frequency setting data "n". Thus, if new frequency setting data is set in data register 24 in response to clock signal CK, frequency divider 18 performs the frequency dividing operation by using the old data "n" till control signal A' rises.

Second control signal B' is supplied to register 28 for preset voltage data. Register 28 fetches the frequency setting data "n" as latched in data register 24 at the time that second control signal B' rises.

As described above, the data "n" fetching operation by frequency divider 18 is performed at the pulse timings of frequency divided signal DS. When data "n" is changed, new frequency setting data is loaded into register 26 under control of first control signal A', and then the data fetching operation of frequency divider 18 is performed at the pulse timings of the next frequency divided signal DS. The timing of the preset voltage changing operation by D/A converter 20 depends on the timing that new frequency setting data "n" is latched into register 28. Accordingly, the new frequency setting data "n" fetching operation by frequency divider 18 and the preset voltage changing operation are performed at the timing that frequency divided signal DS rises. Therefore, at the time of changing the frequency, frequency divider 18 and D/A converter 20 will never operate on the basis of the new and old data. As a result, the phase difference at the time of frequency changing is substantially fixed, ensuring a fast and stable PLL operation.

Latch clock signal CK for data register 24 is not synchronized with the frequency divided signal DS for determining the latch timing of registers 26 and 28. Therefore, there is the possibility that the pulse of frequency divided signal DS appears immediately after the pulse of clock signal CK. When the data fetching operation of registers 26 and 28 is performed at an instant that the first pulse of the frequency divided signal DS as counted from the pulse timing of clock signal CK, appears, the latching operation of data register 26 starts before the latching operation of data register 24 is completed. This possibly results in the erroneous data fetching. To cope with this, the data fetching operation by registers 26 and 28 is delayed by at least one period of frequency divided signal DS.

As described above, according to this invention, the operation for changing the setting of the frequency dividing data by frequency divider 18 is synchronized with the operation for changing the setting of preset voltage by D/A converter 20 on the basis of the pulse timings of reference signal $f_{ref}$ or frequency divided signal DS. Therefore, the frequency changing operation can be stably and fast made.

What is claimed is:

1. A signal generating apparatus comprising:
   voltage controlled oscillator (VCO) means for generating an output signal of said signal generating apparatus, an oscillating frequency of said VCO means being coarsely adjustable by a preset voltage;
   frequency dividing means for frequency dividing the output signal of said VCO means according to a preset frequency divided ratio;
   phase comparing means for comparing the phases of the output signal of said frequency dividing means with a reference signal, and outputting a signal based on the result of said comparison to said VCO means, the oscillating frequency of said VCO means being finely adjustable by the output signal of said phase comparing means;
   data output means for outputting frequency setting data as the data representative of the preset voltage of said VCO means and the data representative of a frequency divided ratio of said frequency dividing means;
   digital to analog (D/A) converting means for converting the frequency setting data from said data output means into the preset voltage, and applying the present voltage to said VCO means; and
   control means, provided between said data output means and said D/A converting means, for receiving said reference signal, and supplying said frequency setting data to said D/A converting means in synchronism with said reference signal.

2. The signal generating apparatus according to claim 1, wherein said control means supplies said frequency setting data to said D/A converting means at the time of the second pulse of said reference signal, after said data outputting means begins to output said frequency setting data.

3. The signal generating apparatus according to claim 2, wherein said control means includes a register which latches said frequency setting data at the time of the second pulse of said reference signal, and outputs the latched data to said D/A converting means.

4. The signal generating apparatus according to claim 3, wherein said control means further includes a control circuit which receives said reference signal and causes said register to latch said frequency setting data at the time of the second pulse of said reference signal.

5. The signal generating apparatus according to claim 4, wherein said control circuit causes said register to latch said frequency setting data at the time that the second pulse of said reference signal.

6. The signal generating apparatus according to claim 1, wherein said data output means includes a register which latches the frequency setting data externally supplied, and outputting the latched data, and said control means supplies said frequency setting data to said D/A converting means at the time of the second pulse of said reference signal, after said register latches said frequency setting data.

7. The signal generating apparatus according to claim 6, wherein said register latches the frequency setting data in response to a control signal externally supplied, and said control means supplies said frequency setting data to said D/A converting means at the time of the second pulse of said reference signal, after said control signal is applied.

8. A signal generating apparatus comprising:
voltage controlled oscillator (VCO) means for generating an output signal of said signal generating apparatus, an oscillating frequency of said VCO means being coarsely adjustable by a preset voltage;
frequency dividing means for frequency dividing the output signal of said VCO means according to a preset frequency divided ratio;
phase comparing means for comparing the phases of the output signal of said frequency dividing means with a reference signal, and outputting a signal based on the result of said comparison to said VCO means, the oscillating frequency of said VCO means being finely adjustable by the output signal of said phase comparing means;
data output means for outputting frequency setting data as the data representative of the preset voltage of said VCO means and the data representative of a frequency divided ratio of said frequency dividing means;
digital to analog (D/A) converting means for converting the frequency setting data from said data output means into the preset voltage, and applying the present voltage to said VCO means; and
control means provided between said data output means and said D/A converting means, for receiving the output signal of said frequency dividing means, and supplying said frequency setting data to said D/A converting means in synchronism with the output signal of said frequency dividing means.

9. The signal generating apparatus according to claim 8, wherein said control means supplies said frequency setting data to said D/A converting means at the time of the second pulse of the output signal of said frequency dividing means, after said data outputting means begins to output said frequency setting data.

10. The signal generating apparatus according to claim 9, wherein said control means includes a register which latches said frequency setting data at the time of the second pulse of the output signal of said frequency dividing means, and outputs the latched data to said D/A converting means.

11. The signal generating apparatus according to claim 10, wherein said control means further includes a control circuit which receives the output signal of said frequency dividing means and causes said register to latch said frequency setting data at the time of the second pulse of the output signal of said frequency dividing means.

12. The signal generating apparatus according to claim 11, wherein said control circuit causes said register to latch said frequency setting data at the time that the second pulse of the output signal of said frequency dividing signal.

13. The signal generating apparatus according to claim 8, wherein said data output means includes a register which latches the frequency setting data externally supplied, and outputs the latched data, and said control means supplies said frequency setting data to said D/A converting means at the time of the second pulse of the output signal of said frequency dividing means, after said register latches said frequency setting data.

14. The signal generating apparatus according to claim 13, wherein said register latches the frequency setting data in response to a control signal externally supplied, and said control means supplies said frequency setting data to said D/A converting means at the time of the second pulse of the output signal of said frequency dividing means, after said control signal is applied.

15. A signal generating apparatus comprising:
voltage controlled oscillator (VCO) means for generating an output signal of said signal generating apparatus, an oscillating frequency of said VCO means being coarsely adjustable by a preset voltage;
data latching means for latching the frequency setting data externally supplied, according to a control signal externally supplied;
frequency dividing means for frequency dividing the output signal from said VCO means according to a frequency dividing ratio based on said frequency setting data and for outputting a frequency divided signal, said frequency dividing means fetching said frequency setting data latched in said data latching means at the pulse timings of said frequency divided signal;
phase comparing means for comparing the phases of the frequency divided signal of said frequency dividing means with a reference signal, and outputting a signal based on the result of said comparison to said VCO means, the oscillating frequency of said VCO means being finely adjustable by the output signal of said phase comparing means;
digital to analog (D/A) converting means for converting the frequency setting data from said data latching means into the preset voltage, and applying the present voltage to said VCO means; and
control means for supplying said frequency setting data latched in said data latching means to said D/A converting means in synchronism with the operation of said frequency dividing means for fetching said frequency setting data, according to said control signal.

16. The signal generating apparatus according to claim 15, wherein said control means comprises: a first register for latching said frequency setting data latched in said latching means and outputting the latched data to said frequency dividing means; a second register for latching the frequency setting data latched in said data latching mean and outputting the latched data to said D/A converter; and a control circuit for causing said first and second registers to latch the latched data in synchronism with the operation of said frequency dividing means for fetching said frequency setting data, in response to said reference signal synchronized with said frequency divided signal, when the phase is locked.

17. The signal generating apparatus according to claim 16, wherein said control circuit produces first and second latch control signals in synchronism with the operation of said frequency dividing means for fetching said frequency setting data, in response to said control signal, and said first and second registers latch the latched data in response to said first and second latch control signals.

18. The signal generating apparatus according to claim 17, wherein said control circuit supplies said first and second latch control signals at the time of the second pulse of said reference signal, after said control signal is applied.

19. The signal generating apparatus according to claim 18, wherein said control circuit supplies said second latch control signal to said second register, immediately after supplying said first latch control signal to said first register.

20. The signal generating apparatus according to claim 19, wherein said control circuit supplies said first latch control signal to said fist register at the time that the second pulse of said reference signal rises, and supplies said second latch control signal to said second register at the time that the second pulse of said reference signal falls.

* * * * *